United States Patent
Jones et al.

(10) Patent No.: US 10,032,753 B2
(45) Date of Patent: Jul. 24, 2018

(54) FLEXIBLE LIGHTING DEVICE HAVING BOTH VISIBLE AND INFRARED LIGHT-EMITTING DIODES

(71) Applicant: Grote Industries, LLC, Madison, IN (US)

(72) Inventors: Scott J. Jones, Woodbury, MN (US); Martin J. Marx, Henderson, NV (US); Timothy W. Brooks, Madison, IN (US); Donald L. Gramlich, Jr., Deputy, IN (US); William L. Corwin, Madison, IN (US); Stanley D. Robbins, Deputy, IN (US)

(73) Assignee: Grote Industries, LLC, Madison, IN (US)

( * ) Notice: Subject to any disclaimer, the term of this patent is extended or adjusted under 35 U.S.C. 154(b) by 225 days.

(21) Appl. No.: 14/310,538

(22) Filed: Jun. 20, 2014

(65) Prior Publication Data
US 2015/0371972 A1    Dec. 24, 2015

(51) Int. Cl.
*F21S 4/00*   (2016.01)
*F21V 21/00*  (2006.01)
(Continued)

(52) U.S. Cl.
CPC .......... *H01L 25/0753* (2013.01); *H01L 33/52* (2013.01); *H01L 33/62* (2013.01);
(Continued)

(58) Field of Classification Search
CPC ......... H01L 33/62; H01L 33/48; H01L 33/52; H01L 25/0753; H05K 1/189;
(Continued)

(56) References Cited

U.S. PATENT DOCUMENTS 4,164,008 A * 8/1979 Miller ................ A41D 27/085
                                            223/52
4,607,444 A * 8/1986 Foster ..................... G09F 13/28
                                            116/28 R
(Continued)

FOREIGN PATENT DOCUMENTS

CN      102832351 A     12/2012
CN      103383102 A     11/2013
(Continued)

OTHER PUBLICATIONS

International Search Report and Written Opinion of the International Searching Authority dated Jul. 28, 2015 in the corresponding PCT international patent application No. PCT/US2015/027691.
(Continued)

*Primary Examiner* — Erin Kryukova
(74) *Attorney, Agent, or Firm* — Posz Law Group, PLC

(57) ABSTRACT

A flexible lighting array, comprising: a flexible substrate; a pair of first electrical connectors formed on the flexible substrate; a pair of second electrical connectors formed on the flexible substrate; an isolation element formed on the flexible substrate between the pair of first electrical connectors and the pair of second electrical connectors; a plurality of first light-emitting elements formed over the pair of first electrical connectors; one or more second light-emitting elements formed over the pair of second electrical connectors; and a transparent covering layer formed over the plurality of first light-emitting elements and the one or more second light-emitting elements, wherein the plurality of first light-emitting elements are configured to emit visible light in a wavelength range of 200 nm to 800 nm, and the one or more second light-emitting elements are configured to emit infrared light in a wavelength range of 800 nm to 1200 nm.

26 Claims, 7 Drawing Sheets

(51) Int. Cl.
| | |
|---|---|
| *F21V 21/08* | (2006.01) |
| *F21V 9/00* | (2015.01) |
| *F21S 8/10* | (2006.01) |
| *H01L 29/18* | (2006.01) |
| *H01L 33/00* | (2010.01) |
| *H01L 29/20* | (2006.01) |
| *H01L 21/00* | (2006.01) |
| *H01L 25/075* | (2006.01) |
| *H01L 33/52* | (2010.01) |
| *H01L 33/62* | (2010.01) |

(52) U.S. Cl.
CPC .......................... *H01L 2924/0002* (2013.01); *H01L 2933/005* (2013.01); *H01L 2933/0066* (2013.01)

(58) Field of Classification Search
CPC ..... H04K 2201/10977; F21Y 2113/005; F21V 21/145; F21V 33/0108; F21V 33/0008; A41D 13/01; G08B 5/004; G08B 5/36
USPC ................. 257/88, 89, 99, 724, 725; 438/28
See application file for complete search history.

(56) References Cited

U.S. PATENT DOCUMENTS

| | | | | |
|---|---|---|---|---|
| 4,774,434 A * | 9/1988 | Bennion | ............. | A41D 27/085 257/E33.056 |
| 4,879,826 A * | 11/1989 | Wittke | .................... | B60R 13/00 40/542 |
| 5,300,788 A | 4/1994 | Fan et al. | | |
| 5,424,924 A * | 6/1995 | Ewing | ...................... | B60Q 1/50 362/249.16 |
| 5,440,461 A * | 8/1995 | Nadel | .................. | A41D 27/085 362/103 |
| 5,455,749 A * | 10/1995 | Ferber | .................... | A41D 1/005 362/103 |
| 5,567,037 A * | 10/1996 | Ferber | ................ | A44C 15/0015 2/905 |
| 5,927,845 A * | 7/1999 | Gustafson | ............... | B64F 1/002 362/152 |
| 6,394,626 B1 * | 5/2002 | McColloch | ............. | F21S 2/005 362/231 |
| 6,734,465 B1 * | 5/2004 | Taskar | .................. | H01L 33/502 257/100 |
| 6,834,395 B2 * | 12/2004 | Fuentes | .................. | A41D 13/01 2/69 |
| 7,592,276 B2 * | 9/2009 | Hill | ......... | D02G 3/441 313/511 |
| 8,779,694 B1 * | 7/2014 | Lindblad | .................... | F21S 4/24 315/185 R |
| 2003/0093805 A1 | 5/2003 | Gin | | |
| 2003/0169160 A1 | 9/2003 | Rodriguez Barros et al. | | |
| 2004/0218041 A1 | 11/2004 | Yagi | | |
| 2007/0129613 A1 | 6/2007 | Rochester et al. | | |
| 2007/0177380 A1 * | 8/2007 | Schultz | ................ | H05K 1/0203 362/249.01 |
| 2008/0179611 A1 * | 7/2008 | Chitnis | .................. | H01L 33/508 257/98 |
| 2009/0114928 A1 | 5/2009 | Messere et al. | | |
| 2010/0271333 A1 | 10/2010 | Lai | | |
| 2010/0289665 A1 * | 11/2010 | Dickie | .................... | G09F 21/02 340/815.4 |
| 2011/0097960 A1 | 4/2011 | Gnade | | |
| 2012/0049203 A1 | 3/2012 | Mondada et al. | | |
| 2012/0170290 A1 * | 7/2012 | Kim | ....................... | H05K 1/186 362/382 |
| 2013/0214300 A1 | 8/2013 | Lerman et al. | | |
| 2014/0362566 A1 * | 12/2014 | Tischler | ................ | F21V 31/005 362/230 |

FOREIGN PATENT DOCUMENTS

| | | |
|---|---|---|
| DE | 102011075021 A1 | 10/2012 |
| TW | M418215 Y | 12/2011 |

OTHER PUBLICATIONS

International Preliminary Report on Patentability mailed by the International Bureau of WIPO dated Dec. 29, 2016 in the corresponding PCT international patent application No. PCT/US2015/027691.

Extended European Search Report dated Nov. 13, 2017 issued in corresponding EP patent application No. 15810497.6.

\* cited by examiner

FLEXIBLE LIGHTING DEVICE HAVING BOTH VISIBLE AND INFRARED LIGHT-EMITTING DIODES

FIELD OF THE INVENTION

The present invention is relates generally to devices having light-emitting elements formed in patterns to be visible at night. More particularly, the present invention relates to devices in which both light-emitting elements that emit visible light and light-emitting elements that emit infrared light are both provided on a single substrate.

BACKGROUND OF THE INVENTION

Light-emitting diodes (LEDs) can be used to provide low-cost, low-power lighting in a variety of situations. In particular, LEDs can provide for identification information that can be visible at night or in other dark environments. One way to achieve this is to use LEDs that emit visible light; another way to achieve this is to use LEDs that emit infrared light. The former makes the lighting visible to the naked eye, while the latter requires infrared viewing technology to see.

By allowing for early identification of objects, particularly human beings, at night, or in other dark environments, it would be possible for detecting parties to take appropriate action, which in some cases could serve to save lives. For example, in military situations it would allow for the quick identification of friendly parties, lessening the chance of injury by friendly fire. Likewise, in non-military situations, a driver at night could identify a walker or a biker at night and take early actions to avoid striking the walker or biker with his vehicle.

In some situations it is desirable to have the light emitted by the LEDs to be visible to the naked eye (e.g., when a driver is looking for walkers or bikers), while in other situations it is desirable to have the light emitted by the LEDs only be visible to someone using infrared viewing technology (e.g., when a soldier is looking to identify friendly combatants). Furthermore, circumstances might change in a given situation calling for what was once a visible signal to become infrared, or for an infrared signal to become visible. For example, police officers engaging in a raid on a building at night might wish to be identified as police only by their compatriots to avoid incidents of friendly fire, while after the raid, the officers might wish to be identified as police by anyone.

It would therefore be desirable to provide a thin, low-power, flexible lighting device that includes both visible light light-emitting elements and infrared light-emitting elements, but that can be manufactured in an economical manner.

SUMMARY OF THE INVENTION

A flexible lighting array is provided, including: a flexible substrate; a pair of first electrical connectors formed on the flexible substrate; a pair of second electrical connectors formed on the flexible substrate; an isolation element formed on the flexible substrate between the pair of first electrical connectors and the pair of second electrical connectors; a plurality of first light-emitting elements formed over the pair of first electrical connectors; one or more second light-emitting elements formed over the pair of second electrical connectors; and a transparent covering layer formed over the plurality of first light-emitting elements and the one or more second light-emitting elements, wherein, the plurality of first light-emitting elements are configured to emit visible light in a wavelength range of 200 nm to 800 nm, and the one or more second light-emitting elements are configured to emit infrared light in a wavelength range of 800 nm to 1200 nm.

The first and second light-emitting elements may be light-emitting diodes.

The plurality of first light-emitting elements may be configured to emit light in a wavelength range of 620 nm to 650 nm.

The plurality of first light-emitting elements may be formed into a first pattern. The one or more second light-emitting elements may be formed into a second pattern different from the first pattern.

The flexible substrate may be attached to one of clothing or a vehicle.

The plurality of first light-emitting elements and the one or more light-emitting elements may be within 12.5 micrometers of being the same height.

The transparent covering layer may be one of a transparent upper substrate or a transparent conformal coat.

A method of manufacturing a flexible lighting array is provided, including: forming a flexible substrate; forming a pair of first electrical connectors on the flexible substrate; forming a pair of second electrical connectors on the flexible substrate; forming an isolation element on the flexible substrate between the pair of first electrical connectors and the pair of second electrical connectors; depositing a plurality of first light-emitting elements over the pair of first electrical connectors; depositing one or more second light-emitting elements over the pair of second electrical connectors; and forming a transparent covering layer over the plurality of first light-emitting elements and the one or more second light-emitting elements, wherein, the plurality of first light-emitting elements are configured to emit visible light in a wavelength range of 200 nm to 800 nm, and the one or more second light-emitting elements are configured to emit infrared light in a wavelength range of 800 nm to 1200 nm.

The first and second light-emitting elements may be light-emitting diodes.

The plurality of first light-emitting elements may be configured to emit light in a wavelength range of 620 nm to 650 nm.

In the depositing of the plurality of first light-emitting elements, the plurality of first light-emitting elements may be formed into a first pattern.

In the depositing of the one or more second light-emitting elements, the one or more second light-emitting elements may be formed into a second pattern different from the first pattern.

The method may further include attaching the flexible substrate to an article of clothing.

The method may further include attaching the flexible substrate to a vehicle.

The plurality of first light-emitting elements and the one or more light-emitting elements may be within 12.5 micrometers of the same height.

The transparent covering layer may be one of a transparent upper substrate or a transparent conformal coat.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These drawings are not necessarily drawn to scale.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Furthermore, elements having the same number represent the same element across the various figures, and throughout the disclosure. Their description is not always repeated for each embodiment, but may be inferred from previous descriptions. Elements that have the same number but have the addition of a letter designator indicate distinct embodiments of a more generic element.

Flexible Lighting Device Using Upper Substrate

Figure 1:
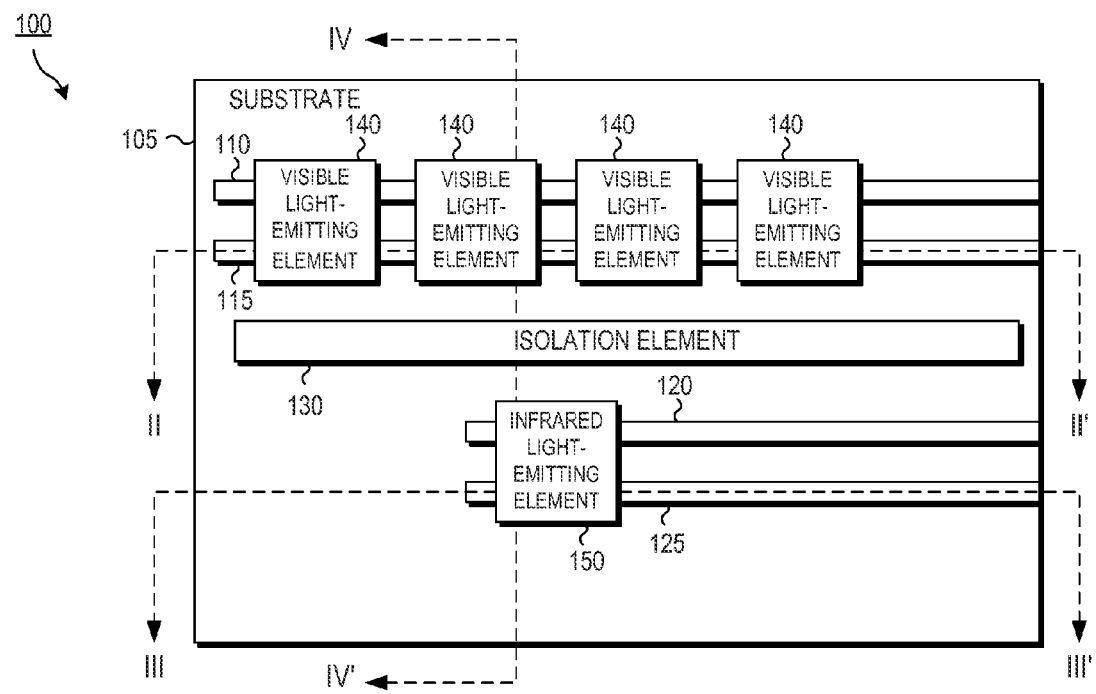
FIG. 1 is an overhead view of a flexible lighting device according to disclosed embodiments.

FIG. 1 is an overhead view of a flexible lighting device 100 according to disclosed embodiments. The overhead view in FIG. 1 is shown without the top layer for clarity of disclosure. However, all of the cross-sectional views of the flexible lighting device 100 of FIG. 1 (FIGS. 2-4 and 6-8) properly show a top layer.

As shown in FIG. 1, the flexible lighting device 100 includes a lower substrate 105, a first conductive element 110, a second conductive element 115, a third conductive element 120, a fourth conductive element 125, an isolation element 130, a plurality of visible light-emitting elements 140, and an infrared light-emitting element 150.

The lower substrate 105 serves as a base for the remainder of the flexible lighting device 100. As a reference direction, the lower substrate 105 can be considered to be a "bottom" substrate upon which the other elements are stacked. However, this is as a point of reference only. The flexible lighting device has no inherent direction, and can be oriented in any manner, even with the lower substrate 105 being on the "top" of the structure.

The lower substrate 105 can be made of polyethylene terephthalate (PET), polyethylene napthalate (PEN), polyester, a polymer, an oxide-coated polymer, a flexible plastic, a metal-coated flexible plastic, or any suitable flexible material. If the entire flexible lighting device needs to be flexible, then the lower substrate 105 should be flexible. Because light does not shine out of the lower substrate 105, it is not necessary for the lower substrate 105 to be transparent to light.

The first and second conductive elements 110, 115 are located on the bottom substrate 105. Each is made of a conductive material that is connected to a control circuit (not shown) used to control the visible light-emitting elements 140 in the flexible lighting device 100, and is configured to carry a control current generated by the control circuit. In the disclosed embodiment, the first and second conductive elements 110, 115 are buss bars used to conduct electricity throughout portions of the flexible lighting device 100. In alternate embodiments the first and second conductive elements 110, 115 could be wires or any other conductive structure that can pass current to the visible light-emitting elements 140.

The first and second conductive elements 110, 115 may be made of copper, silver, aluminum, or any suitable conductive metal or conductive oxide. If the resulting lighting device must remain flexible, the first and second conductive elements 110, 115 should also be configured such that they can bend without breaking or losing their ability to carry a current.

The third and fourth conductive elements 120, 125 are located on the bottom substrate 105. Each is made of a conductive material that is connected to a control circuit (not shown) used to control the infrared light-emitting element 150 in the flexible lighting device 100, and is configured to carry a control current generated by the control circuit. In the disclosed embodiment, the third and fourth conductive elements 120, 125 are buss bars used to conduct electricity throughout portions of the flexible lighting device 100. In alternate embodiments the third and fourth conductive elements 120, 125 could be wires or any other conductive structure that can pass current to the infrared light-emitting element 150.

The third and fourth conductive elements 120, 125 may be made of copper, silver, aluminum, or any suitable conductive metal or conductive oxide. If the resulting lighting device must remain flexible, the first and second conductive elements 120, 125 should also be configured such that they can bend without breaking or losing their ability to carry a current.

The isolation element 130 is configured to provide electrical isolation between the visible light-emitting elements 140 and the infrared light-emitting elements 150 (and also to isolate the first and second conductive elements 110, 115 from the third and fourth conductive elements 120, 125). In the disclosed embodiments, the isolation element 130 is a ground plane, though in alternate embodiments it can be any suitable element that electrically isolates the visible light-emitting elements 140 from the infrared light-emitting element 150. In various embodiments, the isolation element 130 can be a physical element located in the affixing layer that isolates the visible light-emitting elements 140 from the infrared light-emitting element 150, or it could simply be a cut line in the transparent upper substrate 170.

The plurality of visible light-emitting elements 140 are configured to generate visible light, in the range of 200 nm to 800 nm, based on the control current carried on the first and second conductive elements 110, 115. One exemplary visible light-emitting element 140 used in the disclosed embodiments is a visible light-emitting diode (LED). Although not shown, a visible LED has an anode (i.e., a positive side) and a cathode (i.e., a negative side), and operates to generate visible light in the desired wavelength when current flows through the visible LED from the anode to the cathode. In operation, the anode would be electrically connected to the first conductive element 110, and the cathode would be electrically connected to the second conductive element 115.

The infrared light-emitting element 150 is configured to generate infrared light, in the range of 800 nm to 1200 nm, based on the control current carried on the third and fourth conductive elements 120, 125. One exemplary infrared light-emitting element 150 used in the disclosed embodiments is an infrared light-emitting diode (LED). Although not shown, in infrared LED has an anode (i.e., a positive side) and a cathode (i.e., a negative side), and operates to generate infrared light in the desired wavelength when current flows through the visible LED from the anode to the cathode. In operation, the anode would be electrically connected to the third conductive element 120, and the cathode would be electrically connected to the fourth conductive element 125.

Although in the embodiments of FIG. 1, four visible light-emitting elements 140 are shown and only one infrared light-emitting element 150 is shown, this is by way of example only. Various embodiments can have more or fewer visible light-emitting elements 140, and more infrared light-emitting elements 150 formed in a variety of patterns.

Figure 2:
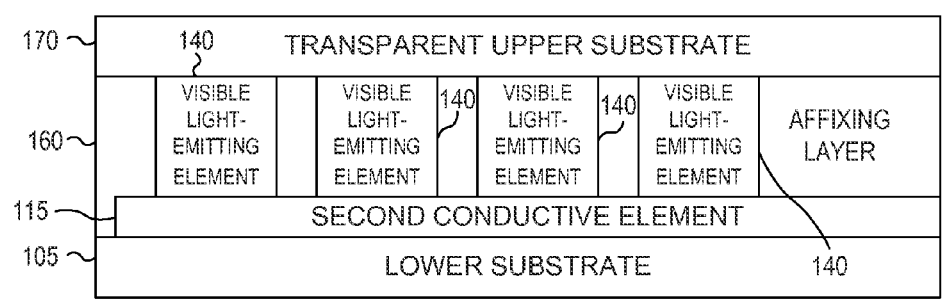
FIG. 2 is a cross-sectional view of the device of FIG. 1 along line II-IP according to first disclosed embodiments.

FIG. 2 is a cross-sectional view of the device 100 of FIG. 1 along line II-II' according to first disclosed embodiments. In particular, FIG. 2 shows embodiments in which a transparent upper substrate 170 is used as a top layer for the device 100.

As shown in FIG. 2, the device 100 includes a lower substrate 105, a second conductive element 115, a plurality of visible light-emitting elements 140, an affixing layer 160, and a transparent upper substrate 170.

The lower substrate 105, second conductive element 115, and visible light-emitting elements 140, operate as disclosed above; that disclosure will not be repeated.

In addition, as shown in FIG. 2, the second conductive element 115 extends underneath all of the visible light-emitting elements 140, and serves to connect these visible light-emitting elements 140 to a control circuit. In embodiments in which the visible light-emitting elements 140 are visible LEDs, the second conductive element 115 is connected to the cathodes of the visible LEDs.

Although not shown in this drawing, the first conductive element 110 is formed in a similar manner. It extends underneath all of the visible light-emitting elements 140, and also serves to connect these visible light-emitting elements 140 to the control circuit. In embodiments in which the visible light-emitting elements 140 are visible LEDs, the first conductive element 110 is connected to the anodes of the visible LEDs.

The transparent upper substrate 170 is provided on top of the visible light-emitting elements 140, and serves to protect the visible light-emitting elements 140 from exposure to the elements and harm from being directly touched. Because light from the visible light-emitting element 140 may need to pass through the transparent upper substrate 170, it is generally desirable that the transparent upper substrate 170 be substantially transparent to the wavelengths of light that are emitted from the visible light-emitting elements 140.

The affixing layer 160 is located over the bottom substrate 105 and around the visible light-emitting elements 140, and is configured to fix the visible light-emitting elements 140 and the transparent upper substrate 170 in place. Because light from the visible light-emitting element 140 may need to pass through the affixing layer 160, it is generally desirable that the affixing layer 160 also be substantially transparent to the wavelengths of light that are emitted from the visible light-emitting elements 140.

Figure 3:
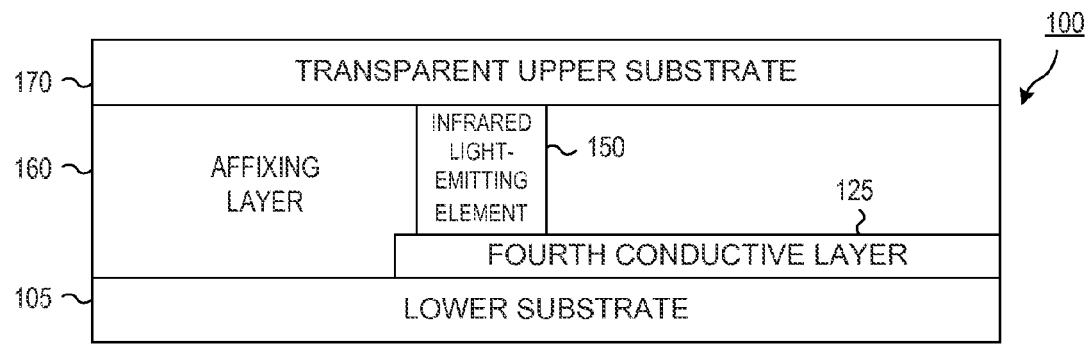
FIG. 3 is a cross-sectional view of the device of FIG. 1 along line III-III' according to first disclosed embodiments.

FIG. 3 is a cross-sectional view of the device 100 of FIG. 1 along line III-III' according to first disclosed embodiments. As with FIG. 2, FIG. 3 shows embodiments in which a transparent upper substrate 170 is used as a top layer for the device 100.

As shown in FIG. 3, the device 100 includes a lower substrate 105, a fourth conductive element 125, an infrared light-emitting element 150, an affixing layer 160, and a transparent upper substrate 170.

The lower substrate 105, fourth conductive element 125, and infrared light-emitting elements 150, operate as disclosed above; that disclosure will not be repeated.

In addition, as shown in FIG. 3, the fourth conductive element 125 extends underneath the infrared light-emitting element 150, and serves to connect the infrared light-emitting element 150 to a control circuit. In embodiments in which the infrared light-emitting element 150 is an infrared LED, the fourth conductive element 125 is connected to the cathode of the infrared LED.

Although not shown in this drawing, the third conductive element 120 is formed in a similar manner. It extends underneath the infrared light-emitting element 150, and also serves to connect the infrared light-emitting element 150 to the control circuit. In embodiments in which the infrared light-emitting element 150 is an infrared LED, the third conductive element 120 is connected to the anode of the infrared LED.

The transparent upper substrate 170 is provided on top of the infrared light-emitting element 150, and serves to protect the infrared light-emitting element 150 from exposure to the elements and harm from being directly touched. Because light from the infrared light-emitting element 150 may need to pass through the transparent upper substrate 170, it is generally desirable that the transparent upper substrate 170 be substantially transparent to the wavelengths of light that are emitted from the infrared light-emitting element 150.

The affixing layer 160 is located over the bottom substrate 105 and around the infrared light-emitting element 150, and is configured to fix the infrared light-emitting element 150 in place. Because light from the infrared light-emitting element 150 may need to pass through the affixing layer 160, it is generally desirable that the affixing layer 160 be substantially transparent to the wavelengths of light that are emitted from the infrared light-emitting element 150.

Figure 4:
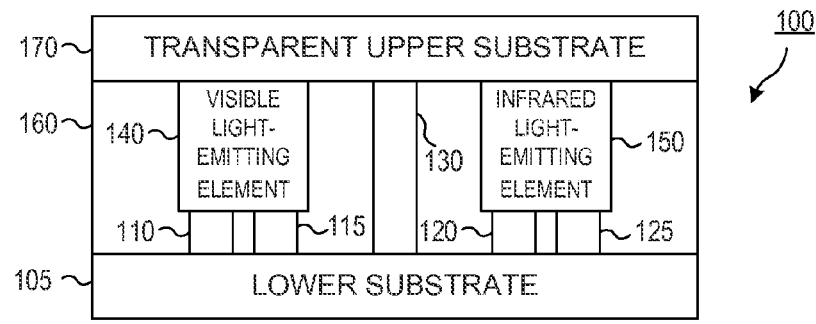
FIG. 4 is a cross-sectional view of the device of FIG. 1 along line IV-IV' according to first disclosed embodiments.

FIG. 4 is a cross-sectional view of the device 100 of FIG. 1 along line IV-IV' according to first disclosed embodiments. As with FIG. 2, FIG. 4 shows embodiments in which a transparent upper substrate 170 is used as a top layer for the device 100.

As shown in FIG. 4, the device 100 includes a lower substrate 105, first through fourth conductive elements 110, 115, 120, 125, an isolation element 130, a visible light-emitting element 140, an infrared light-emitting element 150, an affixing layer 160, and a transparent upper substrate 170.

The lower substrate 105, the first through fourth conductive elements 110, 115, 120, 125, the isolation element 130, the visible light-emitting element 140, the infrared light-emitting element 150, the affixing layer 160, and the transparent upper substrate 170 all operate as disclosed above; that disclosure will not be repeated.

In addition, as shown in FIG. 4, the isolation element 130 is formed between the visible light-emitting element 140 (and the first and second conductive layers 110, 115) and the infrared light-emitting element 150 (and the third and fourth conductive layers 120, 125). In this embodiment, the isolation element 130 extends from the lower substrate 105 to the upper transparent substrate 170. In this way, the isolation element 130 provides maximum isolation between the visible light-emitting element 140 and the infrared light-emitting element 150.

Although in this embodiment, the isolation element 130 is shown as covering the entire distance between the lower substrate 105 and the upper transparent substrate 170, this is by way of example only. In alternate embodiments the isolation element could cover less than the entire distance between the lower substrate 105 and the upper transparent substrate 170. In such embodiments, the isolation element need simply be of sufficient height to allow the visible light-emitting elements 140 and the infrared light-emitting element 150 operate with a sufficiently low amount of interference to meet with acceptable operating parameters. As noted above, however, in alternate embodiments, the isolation element 130 can be a cut line in the transparent upper substrate 170. In this case, the isolation element will be formed entirely in the transparent upper substrate 170.

The transparent upper substrate 170 is provided on top of the isolation element 130, the visible light-emitting element 140, and the infrared light-emitting element 150. It serves to protect the isolation element 130, the visible light-emitting element 140, and the infrared light-emitting element 150 from exposure to the elements and harm from being directly touched.

The affixing layer 160 is located over the bottom substrate 105 and around the isolation element 130, the visible light-emitting element 140, and the infrared light-emitting element 150, and is configured to fix the isolation element 130, the visible light-emitting element 140, and the infrared light-emitting element 150 in place.

As shown in FIGS. 2-4, the visible light-emitting elements 140 and the infrared light-emitting element 150 are formed to have approximately the same thickness, within a given tolerance (i.e., they both should come to approximately the same height from the bottom substrate 105 when put in place). In some preferred embodiments, the visible and infrared light-emitting elements 140, 150 are formed to be within 12.5 μm of the same height. By making them both about the same height, the device may be more easily manufactured, and the resulting structure will be more stable and smoother.

Currently, the manufacturer of visible light-emitting elements and infrared light-emitting elements uses optimal design parameters. Based on these optimal design parameters, the two different light-emitting elements 140, 150 would not be of the same thickness, and therefore would not rise to the same height from the bottom substrate 105 when put in place. This can be addressed by employing less-than-optimal design parameters for at least one of the light-emitting elements 140, 150. The precise trade-offs made in keeping the light-emitting elements 140, 150 at approximately the same height can be balanced during the design of the light-emitting elements 140, 150.

In some embodiments, one of the light-emitting elements 140, 150 could be made using optimal design parameters, while the other of the light-emitting elements 140, 150 could be made using sub-optimal design parameters that made it the same height as the one manufactured using optimal design parameters.

Alternatively, in other embodiments, both of the light-emitting elements 140, 150 can be made using suboptimal designs, such that the taller design is shortened a bit, and the shorter design is heightened a bit, such that they both end up at approximately the same height.

It is also possible, in some embodiments, to alter the height of the light-emitting elements 140, 150 by modifying one more of the buss bars 110, 115, 120, 125, or by modifying the size of an epoxy (not shown in FIG. 4) that secures the light-emitting elements 140, 150 to the lower substrate 105.

Patterning of Visible Lighting Elements and IR Lighting Elements

Figure 5:
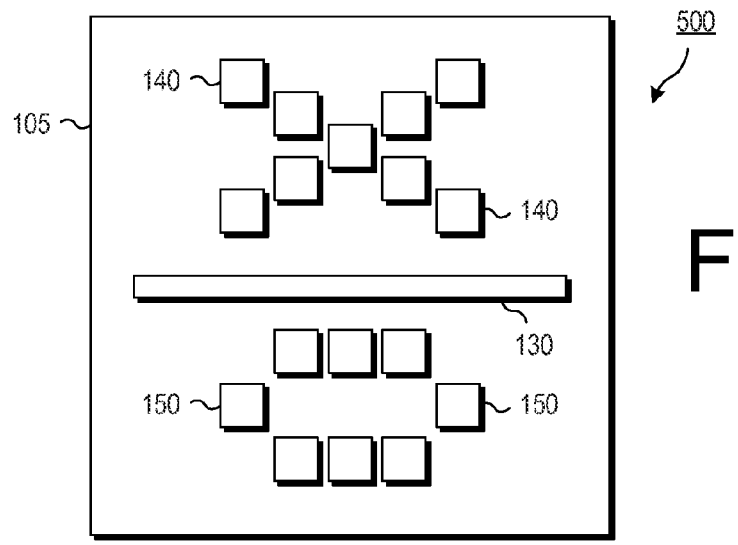
FIG. 5 is an overhead view of an exemplary flexible lighting device according to disclosed embodiments.

FIG. 5 is an overhead view of an exemplary flexible lighting device 500 according to disclosed embodiments. For ease of disclosure, this drawing omits showing the various conductive elements. However, such elements would still be employed.

As shown in FIG. 5, a plurality of visible light-emitting elements 140 are formed in the shape of an X, while a plurality of infrared light-emitting elements are formed in the shape of an O. These shapes are by way of example only, and are meant to show that the visible light-emitting elements 140 and the infrared light-emitting elements 150 can be arranged into shapes, and such shapes need not be the same shape.

For example, a flexible lighting device as disclosed above might be incorporated into the back of a jacket worn by a soldier or a police officer. This jacket may have a first pattern formed using visible light-emitting elements 140, which passes along a first piece of information, and a different second pattern formed on the back of the jacket adjacent to the first pattern using infrared light-emitting elements 150, which passes along a second piece of information. In one particular implementation, the first pattern might spell out the word "POLICE," which could be visible to the naked eye, while the second pattern might provide an alphanumeric identifier for a given officer that would only be visible to someone using infrared viewing technology.

In this way, two separate pieces of information can be formed on the same flexible lighting device, one of which can be seen with the naked eye, and the other of which can be seen using infrared viewing technology. This allows for greater flexibility for the user of the device, since the user can employ one, the other, or both displays at any given time.

As noted above, the plurality of visible light-emitting elements 140 and the plurality of infrared light-emitting elements 150 can be formed in whatever patterns are desired. These can include shapes, alphanumeric phrases, or anything that can be formed out of light-emitting elements.

Figure 10:
FIG. 10 is a diagram of a flexible substrate attached to a piece of clothing according to a disclosed embodiment.
Figure 11:
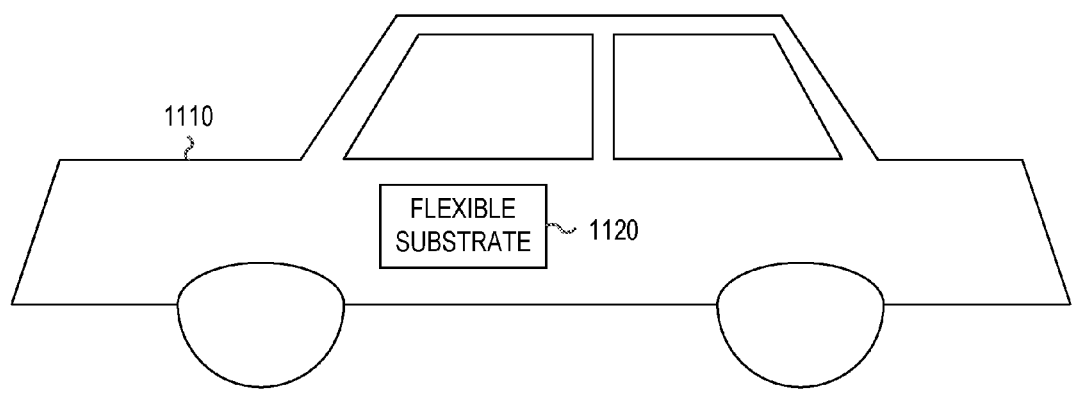
FIG. 11 is a diagram of a flexible substrate attached to a vehicle according to a disclosed embodiment.

In the example above, it is noted that the disclosed flexible lighting devices can be attached to clothing. FIG. 10 is a diagram showing a flexible substrate attached to a piece of clothing. As shown in FIG. 10, a piece of clothing 1010 has a flexible substrate 1020 attached to it. However, this is simply by way of example. It is also possible to connect the disclosed flexible lighting devices to vehicles, buildings, or anything else that needs to be identified in the dark. In each case, at least two different displays are available, one display visible to the naked eye, and one infrared display visible only to those using infrared viewing technology. FIG. 11 is a diagram showing a flexible substrate attached to a vehicle. As shown in FIG. 11, a vehicle 1110 has a flexible substrate 1120 attached to it.

The sets of light-emitting elements on the disclosed flexible lighting devices can even be individually controlled such that in some circumstances they are both turned off, and in other circumstances they are both turned on, and in yet other circumstances one is turned on while the other is turned off. For example, if the flexible lighting device were attached to the clothing or vehicle of a police officer or soldier, there might be some circumstances in which the officer or soldier might wish something to be visible to the naked eye, and other times when the officer or soldier might wish there to be nothing visible to the naked eye, but something visible to anyone using infrared viewing technology (e.g., infrared goggles).

It should be noted that for some patterns of light-emitting elements 140, 150, it may be convenient to employ additional electrical connectors to control the operation of the visible or infrared light-emitting elements 140, 150. In other words, it is not necessary for every light-emitting element 140, 150 on a given side to be connected to the same electrical connector pair. In such embodiments, there may be multiple electrical connector pairs on either the visible side, the infrared side, or both sides of the flexible lighting device 100. This can further increase the flexibility of the device by allowing for finer control of the various late-emitting elements 140, 150. For example, different sets of light-emitting elements on one or the other side of the isolation element 130 could be selectively turned on or off. In such case, the isolation element 130 would be formed in between the one or more pairs of electrical connectors for the visible light-emitting elements 140, and the one or more pairs of political connectors for the infrared light-emitting elements 150.

It is also possible in some embodiments to have multiple areas set aside for visible infrared light-emitting elements 140 and for infrared light-emitting elements 150. For example, four separate areas could be formed as four rectangles placed next to each other, with areas set aside for visible light-emitting elements 140 alternating with areas set aside for infrared light-emitting elements 150. In such case, an isolation element 130 can be placed between each pair of adjacent areas servicing different kinds of light-emitting elements 140, 150.

Alternate Embodiment

Figure 6:
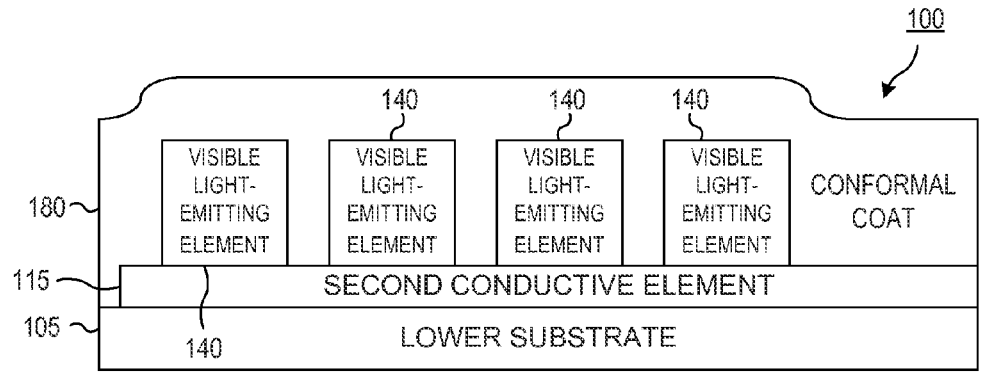
FIG. 6 is a cross-sectional view of the device of FIG. 1 along line II-II' according to second disclosed embodiments.

FIG. 6 is a cross-sectional view of the device 100 of FIG. 1 along line II-IP according to second disclosed embodiments. The embodiments of FIG. 6 differ from the embodiments of FIG. 2 in that they employ a conformal coat 180 as a top layer instead of an affixing layer 160 and a transparent substrate 170.

As shown in FIG. 6, the device 100 includes a lower substrate 105, a second conductive element 115, a plurality of visible light-emitting elements 140, and a conformal coat 180.

The lower substrate 105, the second conductive element 115, and the visible light-emitting elements 140, operate as disclosed above; that disclosure will not be repeated.

The conformal coat 180 is provided on top of the visible light-emitting elements 140, and serves to protect the visible light-emitting elements 140 from exposure to the elements and harm from being directly touched. The conformal coat 180 is also formed around the visible light-emitting elements 140, and is configured to fix the visible light-emitting elements 140 in place. The conformal coat 180 is typically deposited in a viscous form and is then hardened, e.g., using heat or ultraviolet radiation.

Because light from the visible light-emitting elements 140 may need to pass through conformal coat 180, it is generally desirable that the conformal coat 180 be substantially transparent to the wavelengths of visible light that are emitted from the visible light-emitting elements 140.

Figure 7:
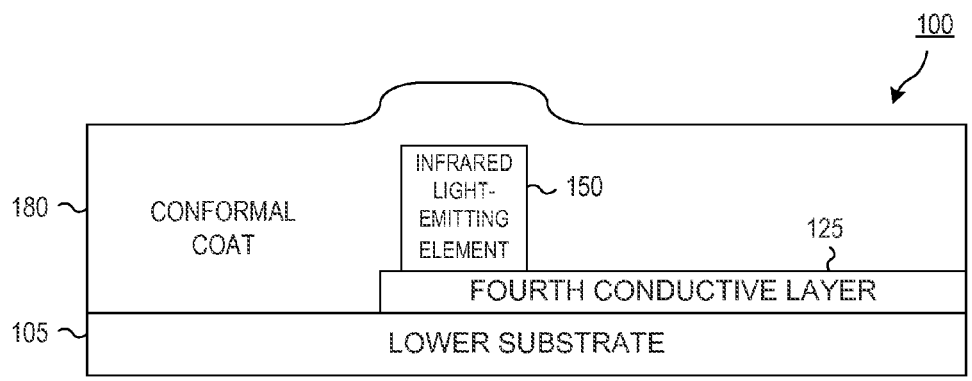
FIG. 7 is a cross-sectional view of the device of FIG. 1 along line III-III' according to second disclosed embodiments.

FIG. 7 is a cross-sectional view of the device 100 of FIG. 1 along line III-III' according to second disclosed embodiments. The embodiments of FIG. 7 differ from the embodiments of FIG. 3 in that they employ a conformal coat 180 as a top layer instead of an affixing layer 160 and a transparent substrate 170.

As shown in FIG. 7, the device 100 includes a lower substrate 105, a fourth conductive element 125, an infrared light-emitting element 150, and a conformal coat 180.

The lower substrate 105, fourth conductive element 125, and infrared light-emitting element 150, operate as disclosed above; that disclosure will not be repeated.

The conformal coat 180 is provided on top of the infrared light-emitting element 150, and serves to protect the infrared light-emitting element 150 from exposure to the elements and harm from being directly touched. The conformal coat 180 is also formed around the infrared light-emitting element 150, and is configured to fix the infrared light-emitting element 150 in place.

Because light from the infrared light-emitting element 150 may need to pass through conformal coat 180, it is generally desirable that the conformal coat 180 be substantially transparent to the wavelengths of infrared light that are emitted from the infrared light-emitting element 150.

Figure 8:
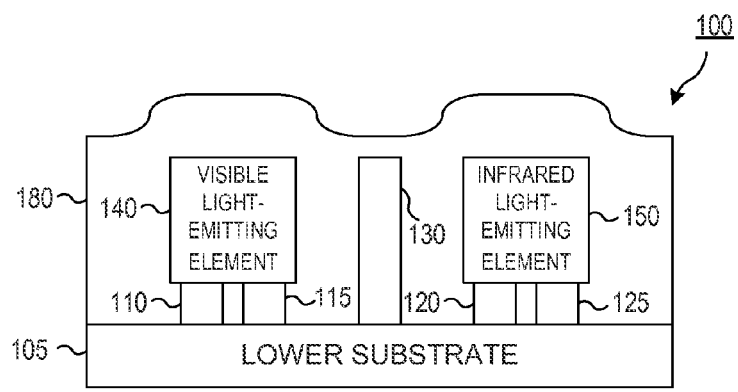
FIG. 8 is a cross-sectional view of the device of FIG. 1 along line IV-IV' according to second disclosed embodiments.

FIG. 8 is a cross-sectional view of the device 100 of FIG. 1 along line IV-IV' according to second disclosed embodiments. The embodiments of FIG. 8 differ from the embodiments of FIG. 4 in that they employ a conformal coat 180 as a top layer instead of an affixing layer 160 and a transparent substrate 170.

As shown in FIG. 8, the device 100 includes a lower substrate 105, first through fourth conductive elements 110, 115, 125, 125, an isolation element 130, a visible light-emitting element 140, an infrared light-emitting element 150, and a conformal coat 180.

The lower substrate 105, the first through fourth conductive elements 110, 115, 120 125, the isolation element 130, the visible light-emitting element 140, and infrared light-emitting element 150, operate as disclosed above; that disclosure will not be repeated.

The conformal coat 180 is provided on top of the isolation element 130, the visible light-emitting element 140, and the infrared light-emitting element 150, and serves to protect these parts of the device from exposure to the elements and harm from being directly touched. The conformal coat 180 is also formed around the isolation element 130, the visible light-emitting element 140, the infrared light-emitting element 150, and is configured to fix them in place.

Flexible Lighting Device Using Conformal Coat

Figure 9:
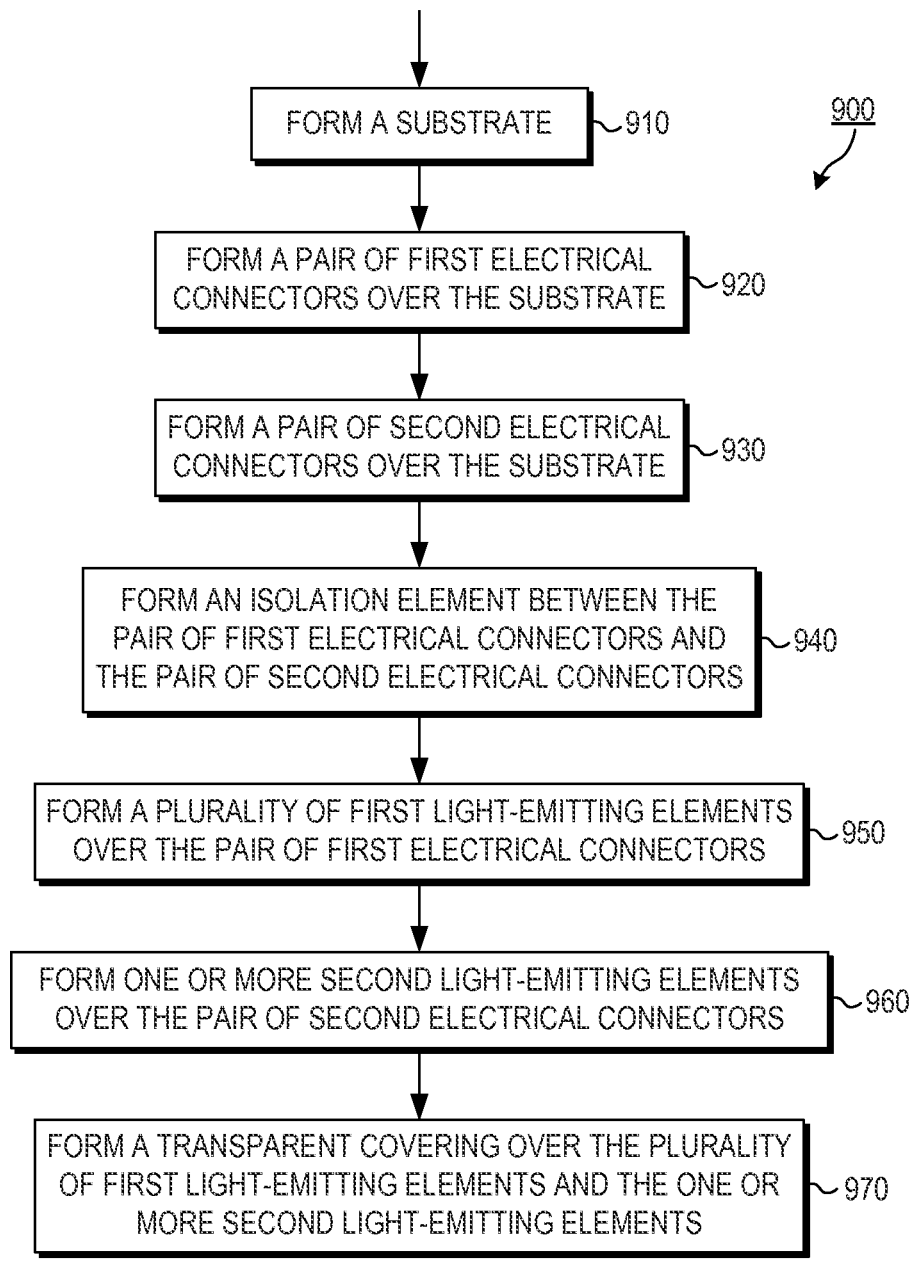
FIG. 9 is a flow chart of a method of manufacturing a flexible lighting device according to disclosed embodiments.

FIG. 9 is a flow chart of a method 900 of manufacturing a flexible lighting device according to disclosed embodiments.

As shown in FIG. 9, the method 900 begins by forming or depositing a substrate on which the remainder of the device can be placed (910).

Then a pair of first electrical connectors are formed or placed over the substrate (920). These are the electrical connectors that will connect up with a plurality of first light-emitting elements.

Next, a pair of second electrical connectors are formed or placed over the substrate (930). These are the electrical connectors that will connect up with one or more second light-emitting elements.

An isolation element is then formed or placed between the pair of first electrical connectors and the pair of second electrical connectors (940).

A plurality of first light-emitting elements are then formed or placed over the pair of first electrical connectors (950). In some embodiments, these first light-emitting elements can be visible light-emitting elements configured to emit light somewhere in the visible spectrum.

One or more second light-emitting elements are then formed or placed over the pair of second electrical connectors (960). In some embodiments, these one or more second light-emitting elements can be infrared light-emitting elements configured to emit light somewhere in the infrared spectrum.

In an alternate embodiment, an affixing layer and a transparent upper substrate can be used in place of the transparent covering. In such an embodiment, the operation of forming a transparent covering over the plurality of first and second light-emitting elements is replaced by steps of forming an affixing layer over the flexible substrate and around the plurality of first and second light-emitting elements to fix the first and second light-emitting elements in place (1270), and forming a transparent upper substrate over the affixing layer (1280).

Finally, a transparent covering is formed over the plurality of first light-emitting elements and the one or more second light-emitting elements (970). In some embodiments, the transparent covering can include a transparent affixing layer and a transparent upper substrate; in other embodiments the transparent covering can include a transparent conformal coat.

Figure 12:
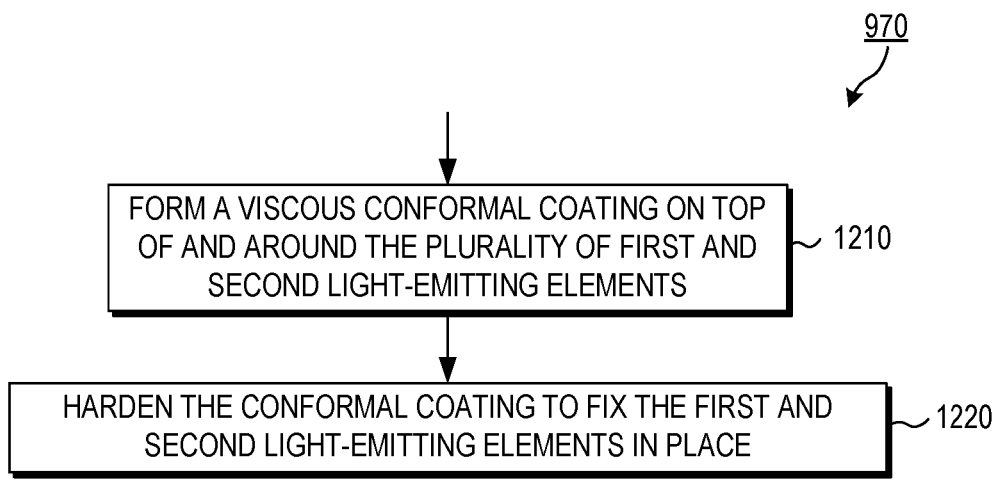
FIG. 12 is a flow chart of a process of depositing a transparent covering over the plurality of light-emitting elements according to a disclosed embodiment.

FIG. 12 is a flow chart of the operation of forming a transparent covering over the plurality of light-emitting elements (970) according to a disclosed embodiment.

As shown in FIG. 12, the conformal coating is initially formed over and around the first and second light-emitting elements in a viscous form (1210). Then, the conformal coating is hardened to fix the first and second light-emitting elements in place (1220).

Figure 13:
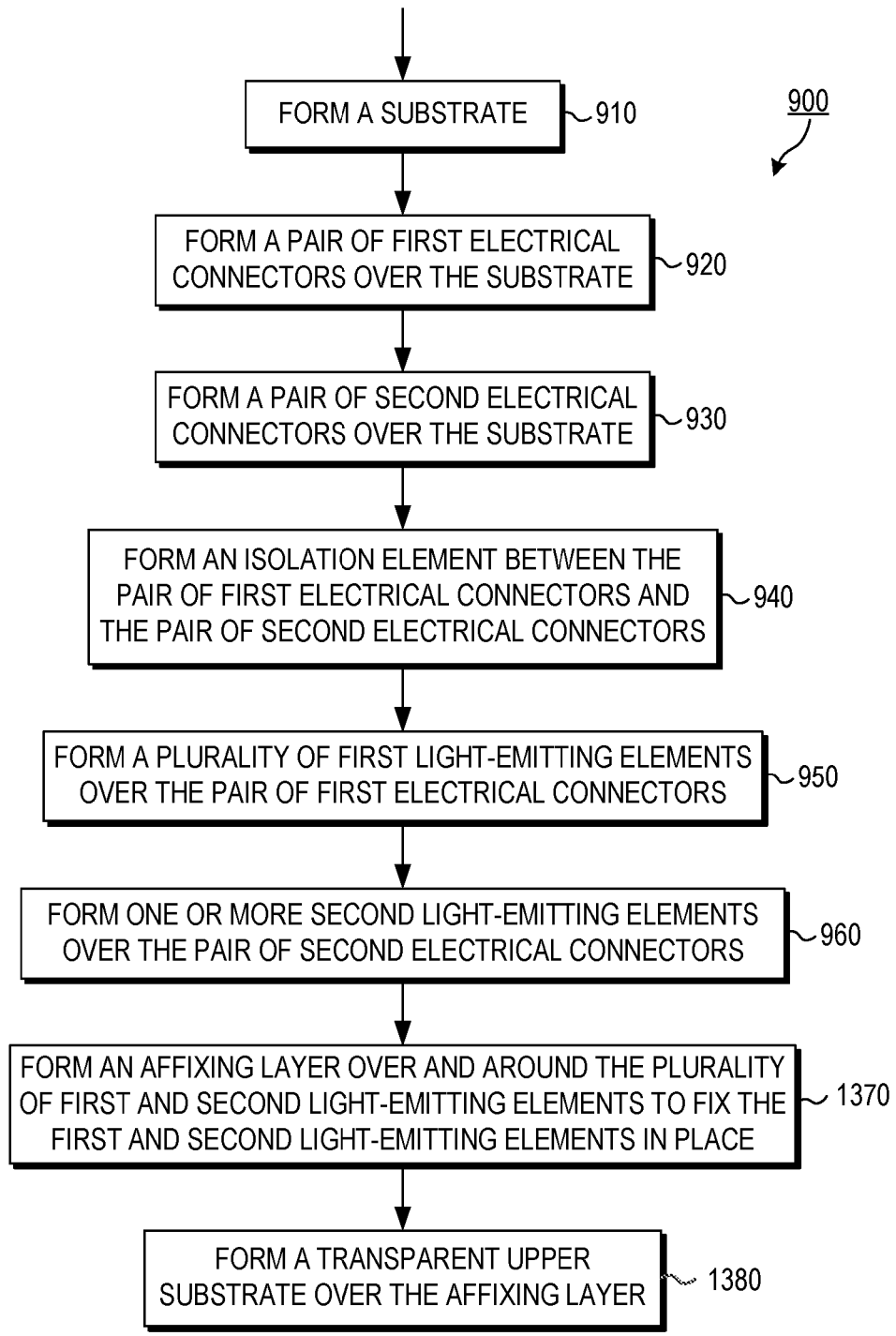
FIG. 13 is a flow chart of a method of manufacturing a flexible lighting device according to an alternate embodiment.

FIG. 13 is a flow chart of a method 1300 of manufacturing a flexible lighting device according to an alternate embodiment.

In this alternate embodiment, an affixing layer and a transparent upper substrate can be used in place of the transparent conformal coating. In such an embodiment, the operation of forming a transparent covering over the plurality of first and second light-emitting elements is replaced by steps of forming an affixing layer over the flexible substrate and around the plurality of first and second light-emitting elements to fix the first and second light-emitting elements in place (1370), and forming a transparent upper substrate over the affixing layer (1380).

Although it is disclosed above that a first set of light-emitting elements transmit visible light, and a second set of light-emitting elements transmit infrared light, this is by way of example only. In alternate embodiments, the two sets of light-emitting elements can both be transmitting visible light of different colors, or could be transmitting any combination of lights of different wavelengths.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A flexible lighting array, comprising:
   a flexible substrate capable of freely bending and returning to its original shape;
   a pair of first electrical connectors formed on the flexible substrate;
   a pair of second electrical connectors formed on the flexible substrate;
   an electrical isolator formed on the flexible substrate and surrounded by at least one material layer on the flexible substrate between the pair of first electrical connectors and the pair of second electrical connectors;
   a plurality of first light-emitting elements formed over the pair of first electrical connectors, the first light emitting elements being light-emitting diodes each having a first anode and a first cathode;
   one or more second light-emitting elements formed over the pair of second electrical connectors, the second light emitting elements being light-emitting diodes each having a second anode and a second cathode; and
   a transparent covering layer formed over the plurality of first light-emitting elements and the one or more second light-emitting elements,
   wherein,
   the plurality of first light-emitting elements are configured to emit visible light in a wavelength range of 200 nm to 800 nm, and
   the one or more second light-emitting elements are configured to emit infrared light in a wavelength range of 800 nm to 1200 nm.

2. The flexible lighting array of claim 1, wherein the first and second light-emitting elements are light-emitting diodes.

3. The flexible lighting array of claim 1, wherein the plurality of first light-emitting elements are configured to emit light in a wavelength range of 620 nm to 650 nm.

4. The flexible lighting array of claim 1, wherein the plurality of first elements are formed into a first pattern.

5. The flexible lighting array of claim 4, wherein
the one or more second light-emitting elements formed over the pair of second electrical connectors are two or more second light-emitting elements formed over the pair of second electrical connectors, and
the two or more second light-emitting elements are formed into a second pattern different from the first pattern.

6. The flexible lighting array of claim 1, wherein the flexible substrate is attached to one of clothing or a vehicle.

7. The flexible lighting array of claim 1, wherein the plurality of first light-emitting elements and the one or more second light-emitting elements are within 12.5 micrometers of being the same height.

8. The flexible lighting array of claim 1, wherein the transparent covering layer is one of a transparent upper substrate or a transparent conformal coat.

9. The flexible lighting array of claim 1, wherein the flexible substrate comprises one of polyethylene terephthalate (PET), polyethylene napthalate (PEN), polyester, an oxide-coated polymer, or a metal-coated flexible plastic.

10. The flexible lighting array of claim 1, further comprising:
an affixing layer formed over the flexible substrate and around the first light-emitting elements, the affixing layer fixing the visible light-emitting elements and the transparent covering layer in place.

11. The flexible lighting array of claim 1, wherein
the transparent covering layer is a conformal coating, and
the conformal coating is formed on top of and around the first light-emitting elements, and serves to fix the first light-emitting elements in place.

12. The flexible lighting array of claim 10, wherein
the affixing layer contacts the first light-emitting element along an entire height of the first light-emitting element, and
the isolator is formed into the affixing layer and the affixing layer is the at least one material layer.

13. A method of manufacturing a flexible lighting array, comprising:
forming a flexible substrate capable of freely bending and returning to its original shape;
forming a pair of first electrical connectors on the flexible substrate;
forming a pair of second electrical connectors on the flexible substrate;
forming an electrical isolator on the flexible substrate such that the electrical isolator is surrounded by at least one material layer between the pair of first electrical connectors and the pair of second electrical connectors;
depositing a plurality of first light-emitting elements over the pair of first electrical connectors, the first light emitting elements being light-emitting diodes each having a first anode and a first cathode;
depositing one or more second light-emitting elements over the pair of second electrical connectors, the second light emitting elements being light-emitting diodes each having a second anode and a second cathode; and
forming a transparent covering layer over the plurality of first light-emitting elements and the one or more second light-emitting elements,
wherein,
the plurality of first light-emitting elements are configured to emit visible light in a wavelength range of 200 nm to 800 nm, and
the one or more second light-emitting elements are configured to emit infrared light in a wavelength range of 800 nm to 1200 nm.

14. The method of claim 13, wherein the first and second light-emitting elements are light-emitting diodes.

15. The method of claim 13, wherein the plurality of first light-emitting elements are configured to emit light in a wavelength range of 620 nm to 650 nm.

16. The method of claim 13, wherein in the depositing of the plurality of first light-emitting elements, the plurality of first light-emitting elements are formed into a first pattern.

17. The method of claim 16, wherein in the depositing of the one or more second light-emitting elements, the one or more second light-emitting elements are formed into a second pattern different from the first pattern.

18. The method of claim 13, further comprising
attaching the flexible substrate to an article of clothing.

19. The method of claim 13, further comprising
attaching the flexible substrate to a vehicle.

20. The method of claim 13, wherein the plurality of first light-emitting elements and the one or more second light-emitting elements are within 12.5 micrometers of the same height.

21. The method of claim 13, wherein the transparent covering layer is one of a transparent upper substrate or a transparent conformal coat.

22. The method of claim 13, wherein the flexible substrate comprises one of polyethylene terephthalate (PET), polyethylene napthalate (PEN), polyester, an oxide-coated polymer, or a metal-coated flexible plastic.

23. The method of claim 13, further comprising:
forming an affixing layer over the flexible substrate and around the two or more first light-emitting elements, wherein
the transparent covering layer is formed over the affixing layer, and
the affixing layer fixes the visible light-emitting elements and the transparent covering layer in place.

24. The method of claim 13, wherein
the transparent covering layer is a conformal coating, and
the conformal coating is formed on top of and around the first light-emitting elements, and serves to fix the first light-emitting elements in place.

25. The method of claim 24,
wherein the transparent covering layer is in a viscous form during the operation of forming a transparent covering layer over the plurality of first light-emitting elements and the one or more second light-emitting elements,
the method further comprising hardening the transparent covering layer using heat or ultraviolet radiation after the operation of forming the transparent covering layer.

26. The method of claim 23, wherein
the affixing layer contacts the first light-emitting element along an entire height of the first light-emitting element, and
the isolator is formed into the affixing layer and the affixing layer is the at least one material layer.

* * * * *